United States Patent [19]

Michii et al.

[11] Patent Number: 5,067,005
[45] Date of Patent: Nov. 19, 1991

[54] SEMICONDUCTOR DEVICE

[75] Inventors: Kazunari Michii; Masataka Takehara, both of Itami, Japan

[73] Assignee: Mitsubishi Denki Kabushiki Kaisha, Japan

[21] Appl. No.: 675,040

[22] Filed: Mar. 26, 1991

Related U.S. Application Data

[63] Continuation of Ser. No. 571,127, Aug. 23, 1990, abandoned.

[30] Foreign Application Priority Data

Aug. 28, 1989 [JP] Japan ................................ 1-218660

[51] Int. Cl.⁵ .......................................... H01L 23/28
[52] U.S. Cl. ...................................... 357/72; 357/51; 357/70; 357/81
[58] Field of Search .................... 357/51, 70, 72, 81

[56] References Cited

U.S. PATENT DOCUMENTS

| | | | |
|---|---|---|---|
| 4,714,952 | 12/1987 | Takekawa et al. | 357/75 |
| 4,823,234 | 4/1989 | Konishi et al. | 357/72 |
| 4,835,120 | 5/1989 | Mallik et al. | 437/209 |

FOREIGN PATENT DOCUMENTS 63-246852 10/1988 Japan.

OTHER PUBLICATIONS

"Nikkei Microelectronics", Jun. 1989, pp. 103-109.
Andrews, "Thermal Characteristics ... DIP's", IEEE, vol. CHMT, No. 4, 1981, pp. 455-460.

*Primary Examiner*—Edward J. Wojciechowicz
*Attorney, Agent, or Firm*—Leydig, Voit & Mayer

[57] ABSTRACT

A semiconductor device having a heat radiating member and a laminated structure for improvements in electrical and heat radiating characteristics. The heat radiating member is partially exposed outside a resin package of the semiconductor device to radiate heat generated by a semiconductor element to the outside of the device. In the laminated structure, a capacitor having a small capacity is formed by two electrically conductive plates one of which is connected to power supply leads and the other of which is connected to a grounded portion of the semiconductor element and to a grounding lead.

10 Claims, 3 Drawing Sheets

SEMICONDUCTOR DEVICE

This application is a continuation of U.S. application Ser. No. 07/571,127, filed Aug. 23, 1990, now abandoned.

BACKGROUND OF THE INVENTION

1. FIELD OF THE INVENTION

This invention relates to a semiconductor device or, more particularly, to the structure of a multi-pin semiconductor device having several hundred or more pins.

2. DESCRIPTION OF THE RELATED ART

Semiconductor devices manufactured by using a type of tape carrier called a "TAB (tape automated bonding)" type have been used as low-cost packages with a very large number of pins. FIGS. 1 and 2 show the structure of this type of conventional semiconductor device. FIG. 1 is a plan view of the semiconductor device with an upper resin portion 8 of a package body 7 (refer to FIG. 2) removed. The package body 7 is a part molded with a resin. FIG. 2 is a cross-sectional view taken along line II—II of FIG. 1. A plurality of electrodes 2 formed on a surface of a semiconductor element (semiconductor chip) 1 are electrically connected to inner lead portions 5 of leads 4 formed on an insulating tape 3. The semiconductor element 1 and the inner leads 5 are molded in the package body 7 formed of a resin, while outer lead portions 6 of the leads 4 extend from the package body 7.

During the operation of this semiconductor device, the semiconductor element 1 generates heat, which is conducted to the outside of the semiconductor device through the leads 4 and the package body 7.

In the thus-constructed conventional semiconductor device, the amount of heat generated by the semiconductor element increases as the degree of integration of the semiconductor element is increased. However, the heat generated by the semiconductor element is not efficiently dissipated to the outside of the semiconductor device because the resin which forms the package body is made of an epoxy resin, for example, which has poor thermal conductivity characteristics. The heat therefore remains in the semiconductor device. If the rate at which the semiconductor element generates heat is high, there is a risk of a malfunction of the semiconductor element owing to the elevated temperature, resulting in reduced reliability of the semiconductor device. Moreover, in the case of a multi-pin package, the length of each lead is increased and the inductance of the leads is thereby increased, which results in a deterioration of the electrical characteristics, e.g., an increase in noise and a reduction in the response speed of the semiconductor device. On the other hand, if the package body is formed of a ceramic material which has superior thermal conductivity characteristics, the semiconductor device can be improved in heat dissipating properties and in response speed. However, such a ceramic body is very expensive and increases the manufacture cost of the semiconductor device.

SUMMARY OF THE INVENTION

In view of these problems, it is an object of the present invention to provide a semiconductor device having improved heat dissipating properties and electrical characteristics while reducing the manufacturing cost thereof.

To this end, the present invention provides a resin-packaged semiconductor device comprising: a semiconductor element having obverse and reverse surfaces and a plurality of electrodes on the obverse surface; an insulating tape peripherally extending along sides of the semiconductor element and having obverse and reverse surfaces; a plurality of leads including a power supply lead, a grounding lead and signal line leads, the leads being fixed on the obverse surface of the insulating tape, the leads being connected at their inner ends to respective electrodes, outer ends of the leads extending outside the semiconductor device; capacitive circuit means on which the semiconductor element, the insulating tape and the plurality of leads are mounted, the capacitive circuit means including first and second electrically conductive plates electrically connected to particular ones of the plurality of leads and/or said semiconductor element, and first and second insulating layers, the second insulating layer being disposed between the electrically conductive plates to form a decoupling capacitor; a heat radiating layer disposed on said reverse surface of said semiconductor, element through the first insulating layer to dissipate heat generated in the semiconductor device; and a resin-molded portion within which the components of the semiconductor device are encapsulated with the outer end portions of the leads and at least a part of the heat radiating layer exposed.

According to this invention, heat generated by the semiconductor element is conducted from the semiconductor element to the heat radiating layer and is dissipated from the heat radiating layer. The electrical characteristics of the power supply system of the semiconductor device and those of particular signal leads can be improved by the decoupling capacitor formed of the alternately laminated conductor plates and insulating layers.

DESCRIPTION OF THE PREFERRED EMBODIMENT

Figure 1:
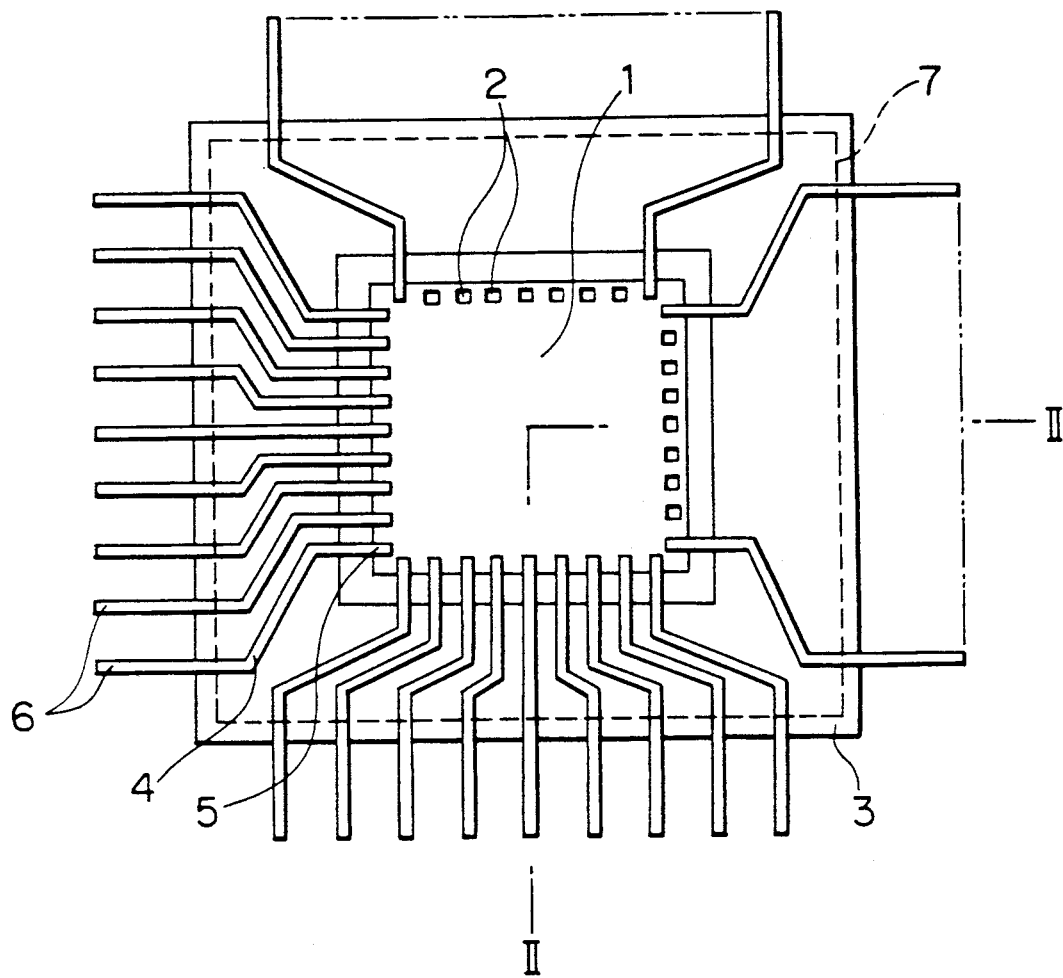
FIG. 1 is a plan view of the interior of a conventional semiconductor device with the upper resin portion removed.
Figure 2:
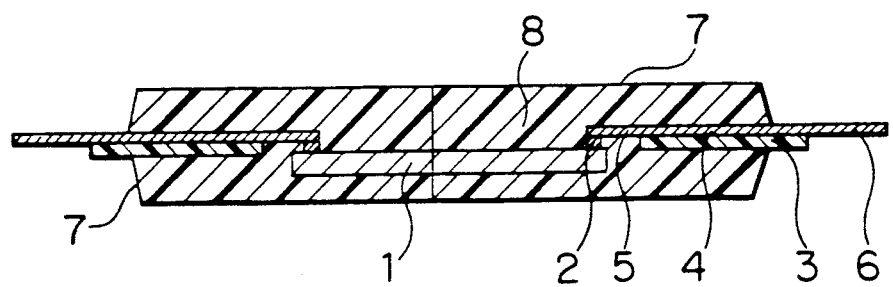
FIG. 2 is a cross-sectional view taken along line II—II of FIG. 1.
Figure 3:
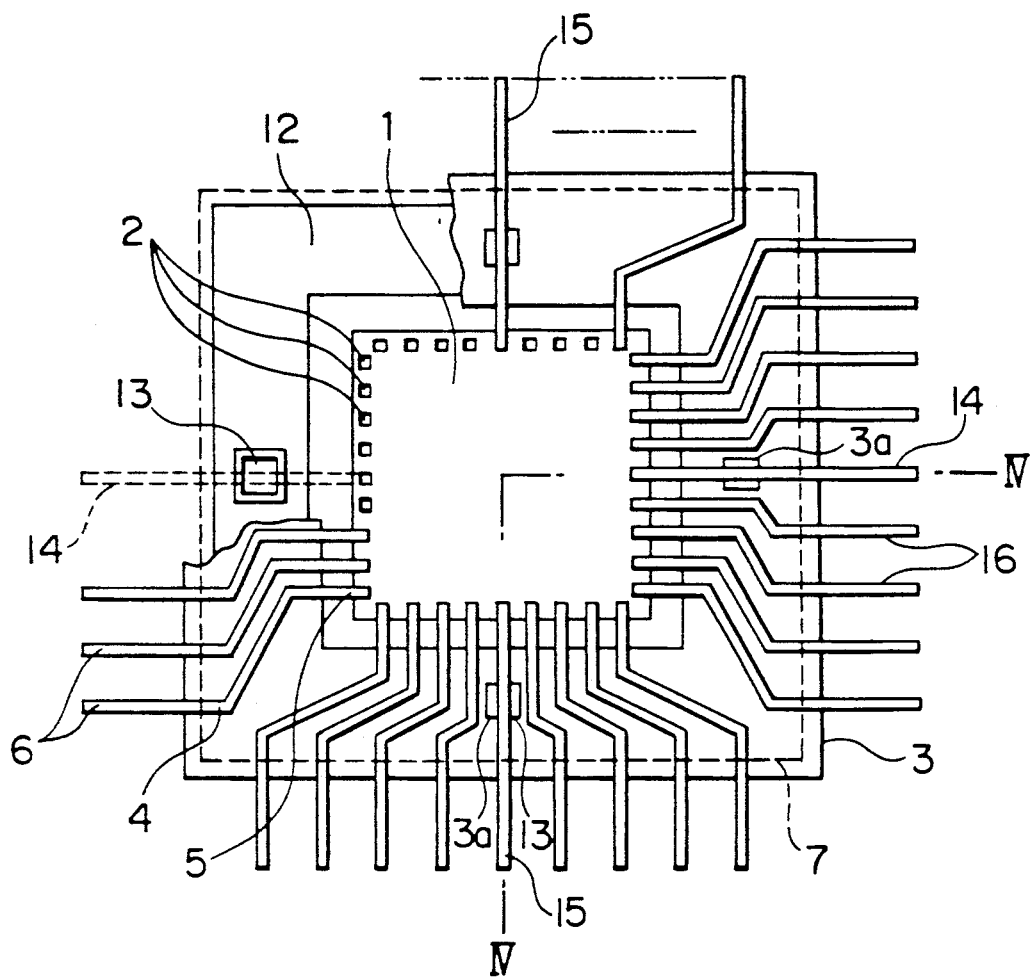
FIG. 3 is a plan view of the interior of a semiconductor device in accordance with an embodiment of the present invention with the upper resin portion removed.
Figure 4:
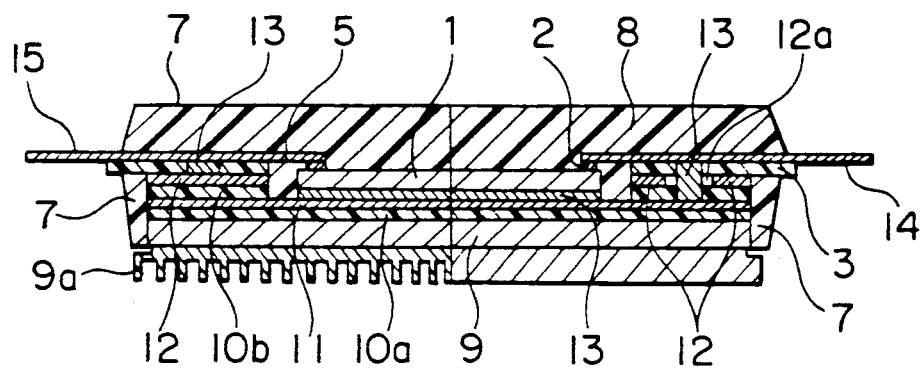
FIG. 4 is a cross-sectional view taken along line IV—IV of FIG. 3.
Figure 5:
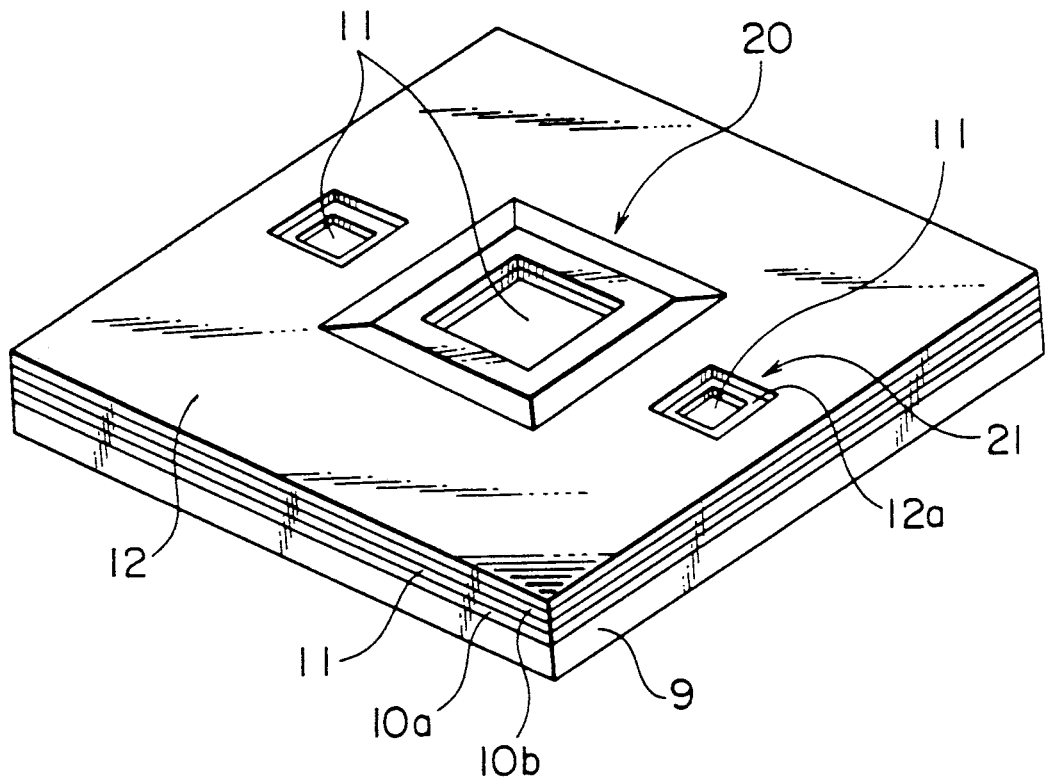
FIG. 5 is a perspective view of a second conductor plate and other portions below the second conductor plate of the semiconductor device shown in FIG. 3.

An embodiment of the present invention will be described below with reference to the accompanying drawings. FIGS. 3 to 5 show a semiconductor device which represents an embodiment of the present invention. In FIGS. 3 to 5, the components identical or corresponding to those of the conventional arrangement are indicated by the same reference characters. FIG. 3 is a plan view of the semiconductor device, showing the interior thereof with an upper resin portion 8 of a package body 7 (refer to FIG. 4) removed and a part of an insulating tape 3 cut away. FIG. 4 is a cross-sectional view taken along line IV—IV of FIG. 3, and FIG. 5 is a perspective view of a second conductor plate 12 and other portions disposed thereunder. A heat radiating member 9 is formed of a material having high heat conductivity containing, for example, copper (Cu) or aluminum (Al). On the heat radiating member 9, a first insulating layer 10a formed of an epoxy resin, a first conductive plate 11 formed of copper foil, a second insulating layer 10b formed of an epoxy resin, and a second conductive plate 12 formed of copper foil are successively laminated. The conductive plates 11 and 12 and the insulating layers 10a and 10b respectively constituting two-layer structures are alternately laminated to form a capacitive circuit means. That is, the first and second conductive plates 11 and 12 form a decoupling capacitor.

A semiconductor element 1 having electrodes 2 bonded to inner leads 5 is fixed by an electrically conductive resin 13 on the first conductive plate 11. The bottom surface of the semiconductor element 1 is thereby electrically connected to the first conductive plate 11. Similarly, grounding leads 14 and power supply leads 15 are fixed on and electrically connected to the first conductive plate 11 and the second conductive plate 12, respectively, by electrically conductive resins 13.

The semiconductor element 1, the leads 4 and the layers are molded in the package body 7 formed of an epoxy resin so that at least outer lead portions 6 of the respective leads and a lower surface of the heat radiating member 9 are exposed outside the semiconductor device. The insulating tape 3, the second conductive plate 12 and the second insulating layer 10b have a through accommodation hole 20 (refer to FIG. 5) for accommodating the semiconductor element 1 and for fixing the same on the first conductive plate 11 and through connection holes 21 for the connection between the grounding leads 14 and the first conductive plate 11 and for the connection between the power supply leads 15 and the second conductor plate 12. Details of these holes are as described below.

Referring to FIG. 3, the grounding leads 14 extend outward through left and right sides of the illustrated semiconductor device, while the power supply leads 15 extend outward in directions of the top and the bottom of FIG. 3. Accordingly, through holes 3a are formed in the insulating tape 3 on four sides. Also, the insulating tape 3 is cut out at its center for placement of the semiconductor element 1. As shown in FIG. 5, the through accommodation hole 20 and the through holes 21 for connection of the grounding leads 14 are formed in the second conductive plate 12 and the second insulating layer 10b disposed below the insulating tape 3. The power supply leads 15 are connected to the second conductive plate 12 by the electrically conductive resin 13 in through holes 3a of the insulating tape 3. The grounding leads 14 are connected to the first conductive plate 11 by the electrically conductive resin 13 in through holes 3a of the insulating tape 3 and in the through connection holes 21 formed in the second conductive plate 12 and the second insulating layer 10b. The semiconductor element 1 is accommodated in the through accommodation hole 20 and is fixed on the first conductive plate 11 by the electrically conductive resin 13. Each through connection hole 21 is formed with a space 12a in the second conductive plate 12 to avoid electrical connection between the conductive plate 12 and the electrically conductive resin for connecting the grounding leads 14.

During the operation of the thus-constructed semiconductor device, heat generated by the semiconductor element 1 is mainly conducted to the heat radiating member 9 having a heat dissipating effect and given off outside the semiconductor device. Since the heat radiating member 9 and the first conductive plate 11 are electrically insulated from each other by the first insulating layer 10a, the back surface electrical potential of the semiconductor element 1 is not applied to the heat radiating member 9. There is therefore no risk of a short circuit or the like even if the heat radiating member 9 is brought into contact with electrical parts or a circuit board when the semiconductor device is mounted on the circuit board. The heat radiating member 9 is partially exposed outside the package 7, thereby enabling an external heat radiating fin 9a to be easily formed on the heat radiating member 9. This construction can therefore be applied to the package of a semiconductor device 1 having an extremely large power consumption.

Since the area of each of the second conductive plate 12 serving as a power supply layer and the first conductive plate 11 serving as a grounding layer is large, it is possible to reduce the inductance of a power supply line extending from the power source to the ground in the semiconductor device. The second insulating layer 10b is interposed between the first and second conductive plates 11 and 12 forms a decoupling capacitor having a small capacity, thereby absorbing noise. Furthermore, since the leads 16 serving as signal lines are placed on the first and second conductive plates 11 and 12, the inductance of each signal line lead 16 is small enough to prevent any substantial signal delay.

In the above-described embodiment, the electrodes of the semiconductor elements and the extreme ends of the inner leads are directly connected. However, the present invention can also be applied to a type of semiconductor device in which electrodes and inner leads are connected through thin metallic wires (not shown).

In accordance with the present invention, as described above, a heat radiating member for radiating the heat generated by the semiconductor element is provided and a laminated structure is also provided in which a capacitor having a small capacity is formed by two electrically conductive plates one of which is connected to power supply leads and the other of which is connected to a portion of the semiconductor element and to grounding leads, thereby constructing a semiconductor device improved in heat dissipating properties and in electrical characteristics.

What is claimed is:

1. A resin-packaged semiconductor device comprising:
    a semiconductor element having obverse and reverse surfaces and a plurality of electrodes on said obverse surface;
    an insulating tape peripherally disposed around said semiconductor element and having obverse and reverse surfaces;
    a plurality of leads, each having inner and outer ends and including a power supply lead, a grounding lead, and signal line leads, fixed to said obverse surface of said insulating tape, said leads being connected at their inner ends to respective electrodes, the outer ends of said leads extending beyond said insulating tape;
    capacitive circuit means on which said semiconductor element, said insulating tape, and said plurality of leads are mounted, said capacitive circuit means including first and second electrically conductive plates respectively electrically connected to at least one of said plurality of leads and said semiconductor element, and first and second insulating layers, said second insulating layer being disposed between said electrically conductive plates to form a decoupling capacitor, said reverse surface of said semiconductor element being disposed on said first insulating layer;

a heat radiating layer disposed on said first insulating layer opposite said semiconductive element for radiating heat generated in the semiconductor device; and a resin encapsulating said semiconductor element, said first and second conductive plates, and said first and second insulating layers, the outer end portions of said leads extending from the resin and at least part of said heat radiating layer not being encapsulated by said resin.

2. A resin-packaged semiconductor device according to claim 1, wherein said first conductive plate of said capacitive circuit means is electrically connected to said reverse surface of said semiconductor element and to said grounding lead and the second conductive plate is connected to said power supply lead.

3. A resin-packaged semiconductor device according to claim 2, wherein said capacitive circuit means comprises said second conductive plate, said second insulating layer, said first conductive plate, and said first insulating layer successively laminated and disposed between the reverse surface of said insulating tape and said heat radiating layer, said insulating tape, said second conductive plate, and said second insulating layer having a through accommodation hole in which said semiconductor element is disposed, said reverse surface of said semiconductor element being electrically connected to said first conductive plate, and through connection holes through which said ground and power supply leads are respectively electrically connected to said first and second conductive plates, said semiconductor element being fixed on and electrically connected to said first conductive plate with an electrically conductive resin, said ground and power supply leads and said first and second conductive plates being fixed to and electrically connected through said through connection holes by electrically conductive resins, respectively.

4. A resin-packaged semiconductor device according to claim 3, wherein said semiconductor element, the inner lead portions of said leads, and said laminated layers are covered with the resin, and outer lead portions of said leads and said heat radiating layer are not covered by the resin.

5. A resin-packaged semiconductor device according to claim 1, wherein said electrodes are directly connected to respective leads.

6. A resin-packaged semiconductor device according to claim 1, wherein said heat radiating layer has a high heat conductivity.

7. A resin-packaged semiconductor device according to claim 6, wherein said heat radiating layer is made of a material containing copper.

8. A resin-packaged semiconductor device according to claim 6, wherein said heat radiating layer is made of a material containing aluminum.

9. A resin-packaged semiconductor device according to claim 1, wherein said first and second electrically conductive plates are copper foils and said first and second insulating layers and said resin portion are an epoxy resin.

10. A resin-packaged semiconductor device according to claim 3, wherein said heat radiating layer comprises heat radiating fins.

* * * * *